(12) United States Patent
Tsai et al.

(10) Patent No.: US 6,376,813 B1
(45) Date of Patent: Apr. 23, 2002

(54) PLASMA DISPLAY PANEL WITH A HEATING MEANS FOR TEMPERATURE BALANCE AND THE METHOD OF THE SAME

(75) Inventors: Tzeng-Shii Tsai, Hsinchu; Chien-Hsing Li, Taichung; Huang Yu-Ming, Kaohsiung, all of (TW)

(73) Assignee: Acer Display Technology, Inc. (TW)

( * ) Notice: Subject to any disclaimer, the term of this patent is extended or adjusted under 35 U.S.C. 154(b) by 0 days.

(21) Appl. No.: 09/625,082

(22) Filed: Jul. 25, 2000

(51) Int. Cl.⁷ .............................................. H05B 1/02
(52) U.S. Cl. ........................................................ 219/497
(58) Field of Search ................................ 219/497, 499, 219/501, 483, 486, 121.52, 121.36; 313/495, 582, 484; 315/169.4; 385/2–14

(56) References Cited

U.S. PATENT DOCUMENTS

| | | | |
|---|---|---|---|
| 4,520,290 A | * 5/1985 | Cokefair | 313/15 |
| 4,542,283 A | * 9/1985 | Leverenz | 219/483 |
| 4,969,849 A | * 11/1990 | Smith et al. | 29/620 |
| 5,514,933 A | * 5/1996 | Ward et al. | 313/582 |
| 6,130,502 A | * 10/2000 | Kobayashi et al. | 313/446 |

* cited by examiner

Primary Examiner—Mark Paschall
(74) Attorney, Agent, or Firm—Blakely Sokoloff Taylor & Zafman, LLP (57) ABSTRACT

A plasma display device is disclosed. The plasma display device includes a plasma display panel having a display area and a non-display area, driving circuits, comparator control circuits, and heating elements mounted on the non-display area of the plasma display panel. The non-display area surrounds the display area. A part of the driving circuit and a corresponding heating element may be a Wheatstone bridge circuit. Each comparator control circuit is coupled to the Wheatstone bridge circuit so as to control the heating element. When a portion of the display area is lit, a heating element located on the adjacent non-display area is then activated through the current balance of the Wheatstone bridge circuit and under the control of the driving circuit and the comparator control circuit. Thus, the temperature difference between the display area and the non-display area is reduced.

11 Claims, 10 Drawing Sheets

FIG. 1A(Lengthwise direction)
(PRIOR ART)

FIG. 1B (Lateral direction)
(PRIOR ART)

PLASMA DISPLAY PANEL WITH A HEATING MEANS FOR TEMPERATURE BALANCE AND THE METHOD OF THE SAME

FIELD OF INVENTION

The present invention relates to a plasma display panel (PDP), and more specifically, to a plasma display panel for approaching a temperature balance by a eating apparatus formed on a glass panel and the method of the same.

BACKGROUND

A plasma display panel (PDP) is a self-luminous flat display device. Since plasma display panels allow high speed display and make them easy to make large-sized display compared to liquid crystal panels. Thus, they are highly expected to be applicable in the area of a display of television pictures such as display for high definition TV, a monitor of a computer and public relations display units.

The plasma display panel includes a pair of glass panels that are sealed so as to form a chamber. Predetermined ionizable gases are filled in the chamber at a low atmospheric pressure. Typically, the chamber contains neon and/or argon. The anodes are formed on the inside surface of one of the glass panels, and the cathodes are located on the inside surface of the other. An electric potential applied between the pair of glass causes the gases between thereof to ionize, therefore illuminating light. Visible picture may be displayed through upper glass panel by applying potential to a selected anode. The plasma display panel uses a matrix display system.

To display an image, sequential addressing is carried out line by line to select and charge cells that are to emit light. A voltage is used to alter polarity for sustaining a light emitting state. If the voltage is repeatedly applied at a cycle, continuous light emission can be obtained. In the PDP, plasma discharge is caused between anodes and cathodes facing each other in discharge spaces formed between a front glass substrate and a rear glass substrate, and the ultraviolet ray generated by a gas contained in the discharge spaces for displaying. In order to keep the spread of discharge in certain regions for displaying in specified cells, barrier ribs (also called barriers or ribs) are formed and they are typically formed in stripes.

Figure 1A:
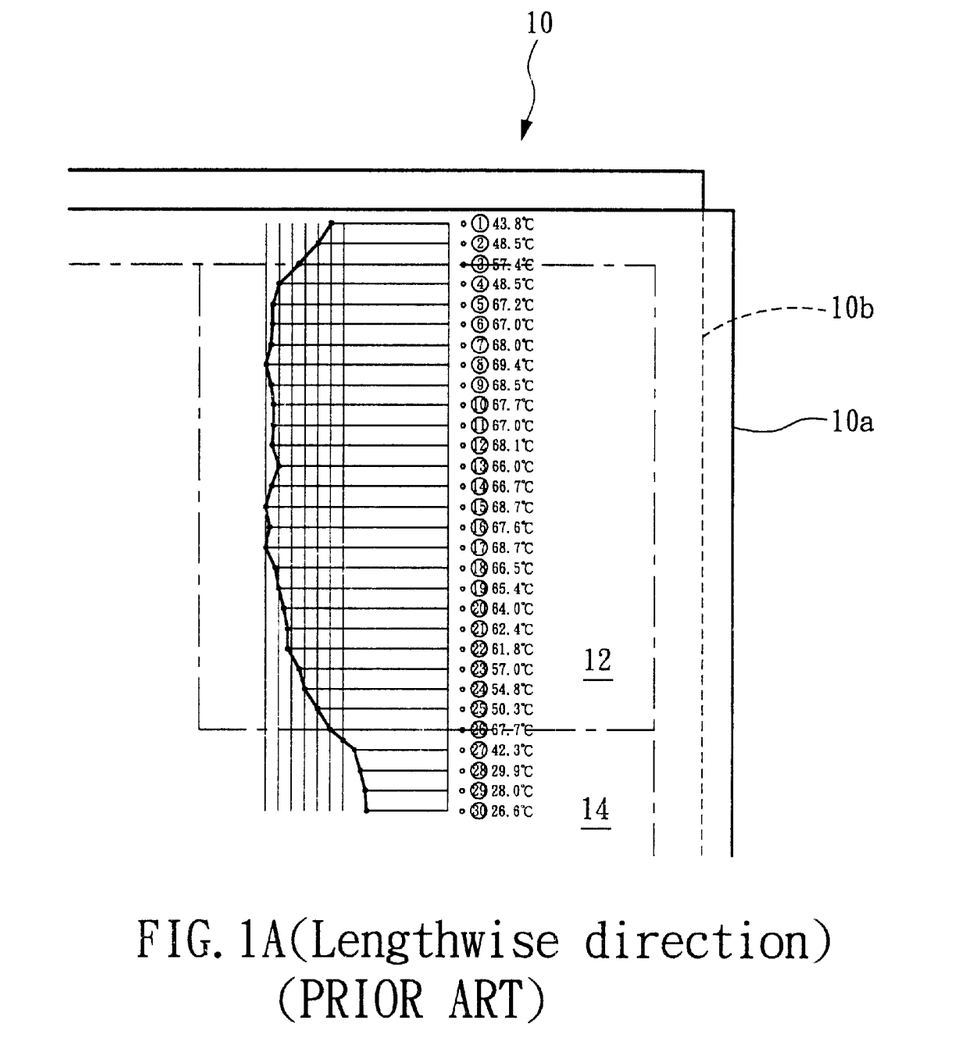
FIG. 1A shows the temperature distribution of the glass panel along the lengthwise direction according to the prior art.
Figure 1B:
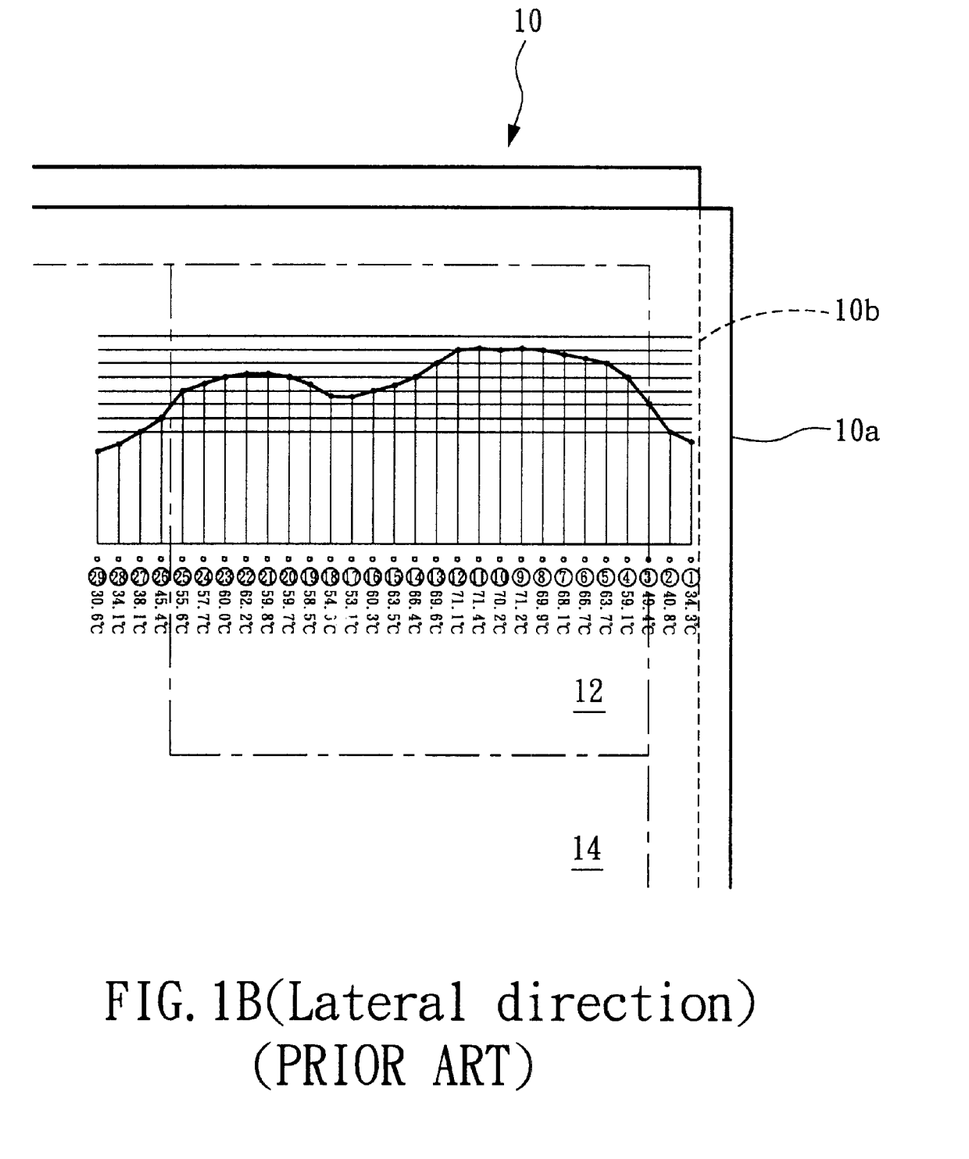
FIG. 1B shows the temperature distribution of the glass panel along the lateral direction according to the prior art.

The prior art plasma display has a problem that the temperature levels of the "bright display" area and "dark display" area are different while static pictures are display. Therefore, the thermal distribution is variant. FIG. 1A and FIG. 1B show the thermal distribution of the glass panel 10 consisting of a front glass 10a and a rear glass 10b. A small bright image (bright display) 12 is present in a dark background (dark display) 14. As shown in FIGS. 1A and 1B, the temperature at the bright image 12 is about 68° C. and the temperature in the non-display area next to the bright image 12 drops to about 40° C. The thermal gradient variation of this area is extremely high and the variation of the temperature is high enough to raise the thermal stress in the glass. The stress may accumulate in the structure of the glass, thus resulting in fracture of the glass. There is a great risk of fracture of the plasma display panel.

Figure 2:
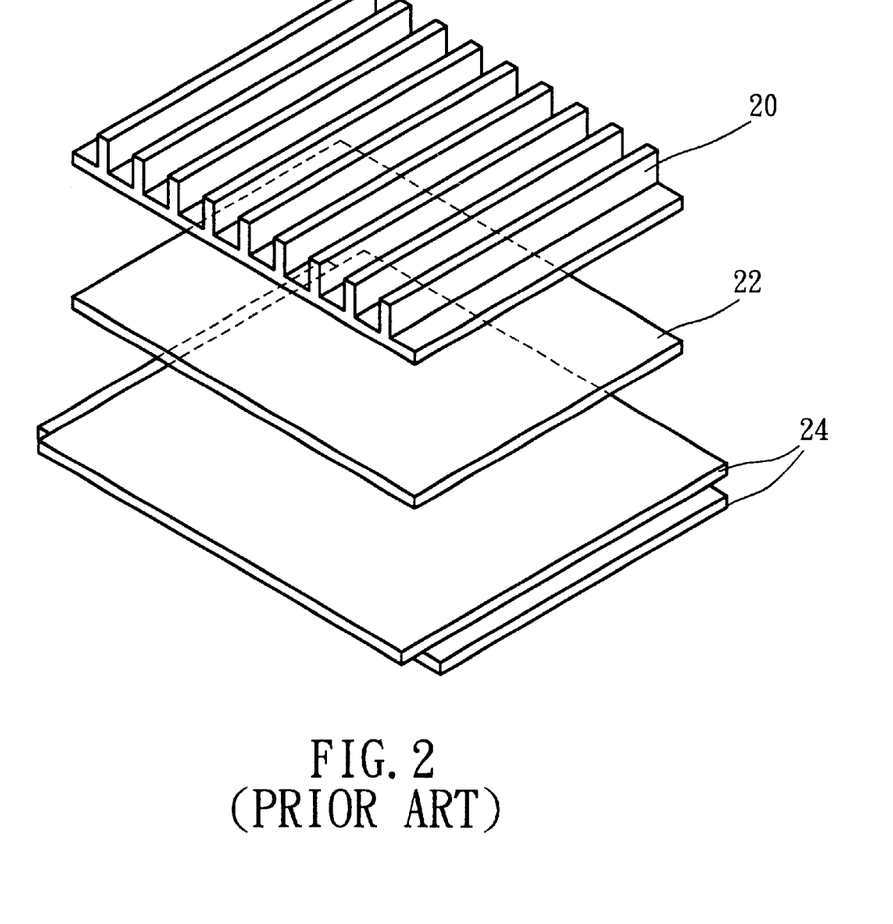
FIG. 2 illustrates a glass panel having a thermal spreading element and a thermal conductive material according to the prior art.
Figure 2A:
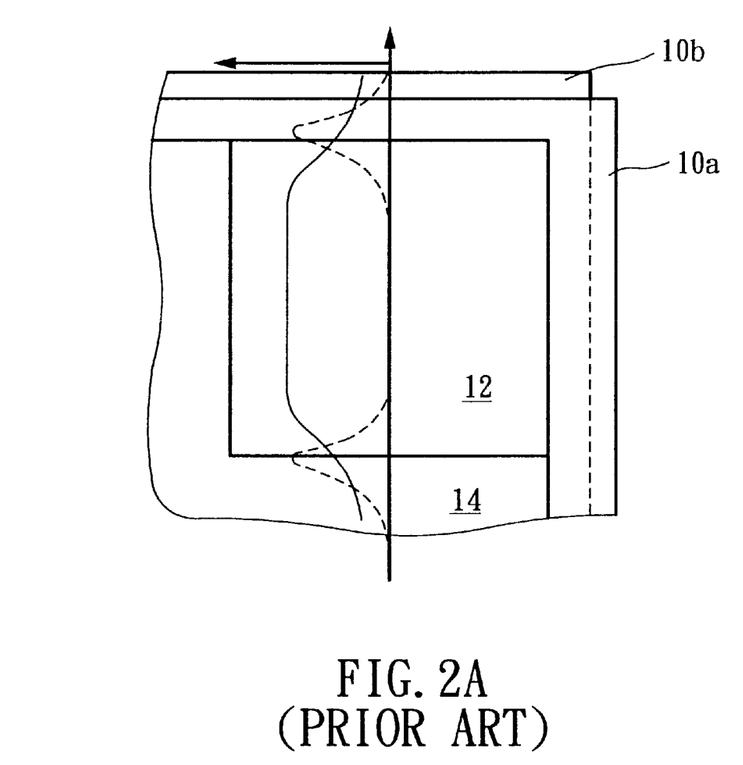
FIG. 2A shows the stress distribution (dashed line) and temperature distribution (solid line) of the glass panel along the lengthwise direction according to the prior art.
Figure 2B:
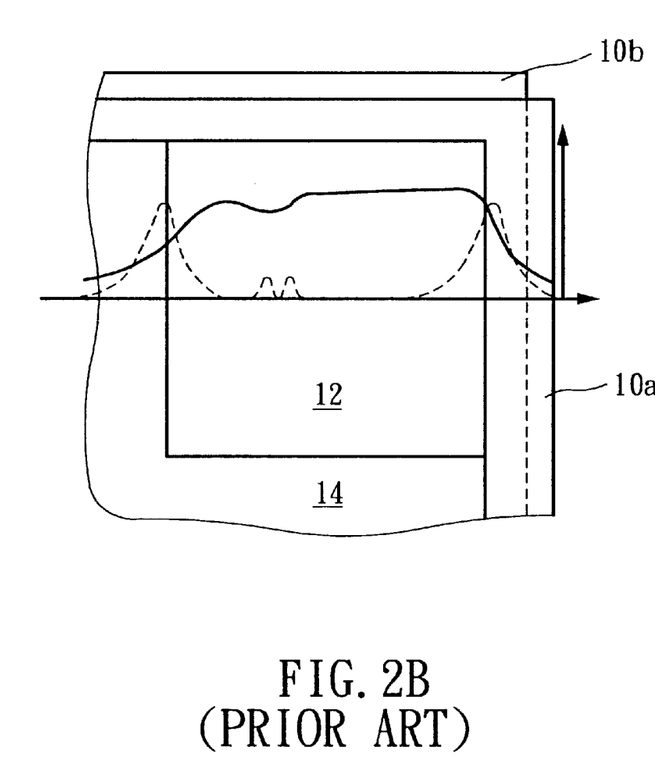
FIG. 2B shows the stress distribution (dashed line) and temperature distribution (solid line) of the glass panel along the lateral direction according to the prior art.

The prior art approaches to solve the problem by attaching a thermal spreading element or thermal conductive material, it can be found in U.S Pat. No. 5, 971,566 as shown in FIG. 2. The thermal spreading element 20 and/or the thermal conductive material 22 is formed on the surface of the glass panel 24 for reducing the heat. The temperature is decreased by the structure, however, the stress is still residual in the glass because the design of the prior art reduces the temperature of the entire surface. The thermal gradient variation problem remains in he structure constructed by the front glass substrate and a rear glass substrate. FIGS. 2A, 2B show that the stress is still too high at the non-display area of the "bright display" area 12. In these figures, the dash lines indicate the stress distribution, and the solid line represents the temperature distribution. In addition, the cost is too high for making such thermal conductive material 22 on the entire surface.

Thus, there exits a need for an apparatus for plasma display panel that is effective to maintain a smoother thermal gradient across the glass panel.

SUMMARY

An object of the present invention is to provide a heating element on a non-display area of a glass panel for thermal balance. The heating element is turned on or off depending on the temperature of the panel to achieve thermal balance.

The present invention provides a plasma display device which includes a plasma display panel and at least one heating element for heating the plasma display panel. The heating element is formed on a non-display area of the plasma display panel to achieve thermal balance, wherein the heating element adjacent to a bright display area is turned on and the heating element adjacent to a dark display area is turned off. A driving circuit is provided to respond to the temperature of the glass panel to switch the plurality of heating elements. The device may further comprise a sensor to detect a temperature of the plasma display panel.

The present invention also provides a control module for a plasma display device to approach a thermal balance. The control module includes a display panel on which a display area and a non-display area surrounding the display area. At least one heating element is formed on the non-display area for heating the display panel. A driving circuit is coupled to the heating element for switching the heating element. A comparator control circuit is coupled to the driving circuit and responsive to the heating element to send a signal to the driving circuit to control the heating element. The control module further includes a circuit embedded in the control module, wherein the circuit and the heating element construct a Wheatstone Bridge Circuit.

A method for thermal balance for a plasma display device is also disclosed by the present invention. The method includes a step of providing at least one heating element on a non-display area of a glass panel of the plasma display device. Then, a means for heating is provided to heat the glass panel by using the heating element to increase a temperature of the non-display area of the glass plane. Preferably, the temperature of the glass panel is increased between a maximum temperature of a bright display area of the plasma display device and a minimum temperature of the non-display area.

The heating elements adjacent to a bright display area of the glass panel is turned on and the heating elements adjacent to a dark display area of the display panel is turned off.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention proposes a novel method and a novel apparatus to reduce the variation gradient of the temperature distribution on the plasma display panel, thereby effectively reducing the thermal stress residual in the glass structure. According to the present invention, at least one heating element is formed on the non-display area of the panel, and the non-display area surrounds the display area of the panel. The heating element is formed on the non-display area of the panel. Preferably, the heating element can be divided into a plurality of sections and each section can be separately turned on to heat the neighboring area for temperature balance. In other words, if one portion of the non-display area is adjacent to a bright display area, then the corresponding heating element of that portion is active to generate heat to raise the temperature of the neighboring area. Therefore, the temperature difference between the bright display area and the adjacent portion of the non-display area is reduced. Preferably, the temperature raised by the heating element is between the original temperature of the non-display area and the temperature of the bright display area.

The heating element according to the present invention can be attached on the surface of the front glass, rear glass or both. Under such structure, the thermal stress can be reduced. Hereinafter, the preferred embodiment of the present invention will be described with reference to accompanying drawings. The detailed description can be seen as follows.

Figure 3:
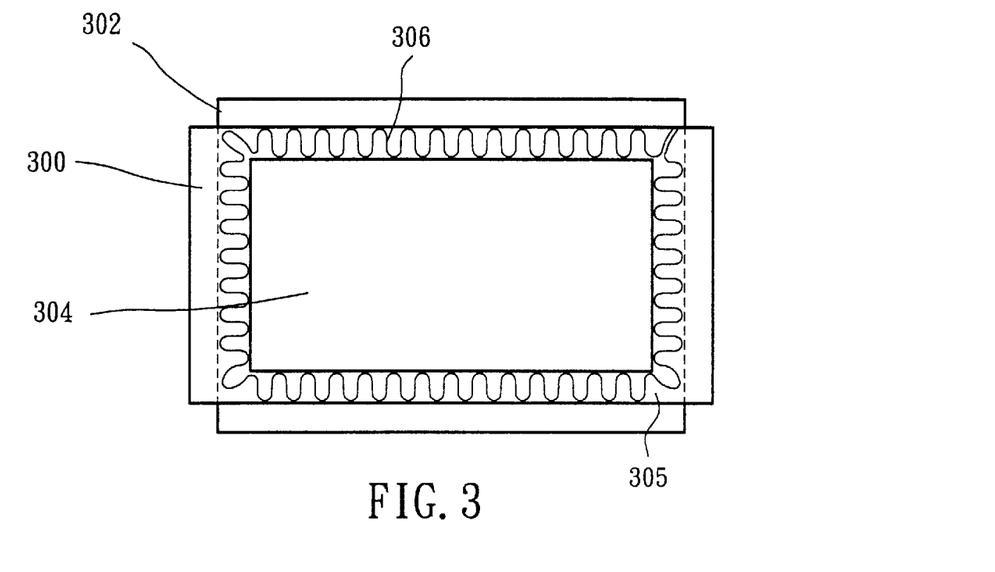
FIG. 3 illustrates a display panel having heating element formed thereon according to the present invention.
Figure 3A:
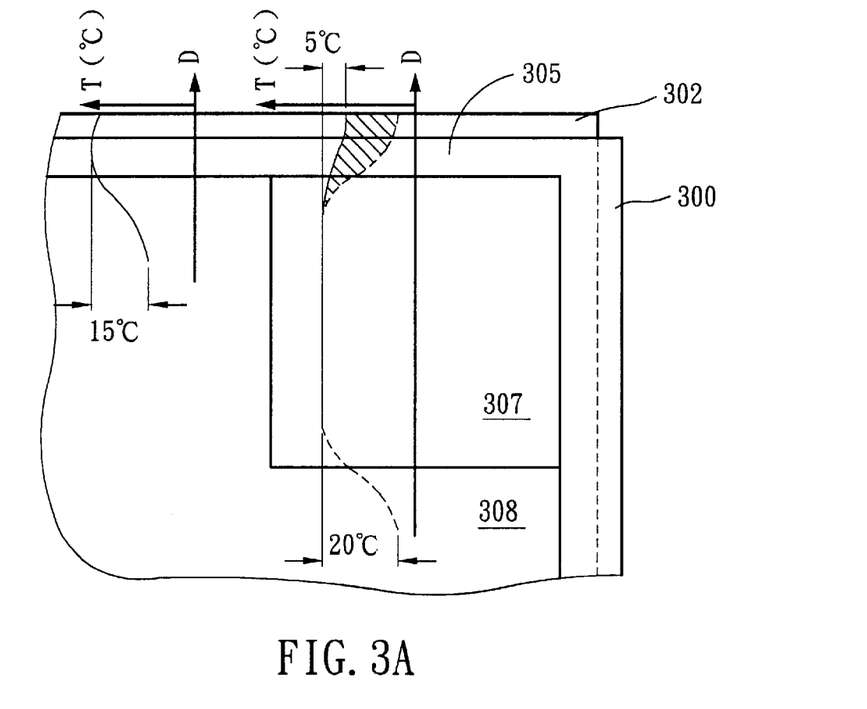
FIG. 3A illustrates the temperature distribution of the display panel having heating element according to the present invention.

Referring to FIGS. 3 and 3A, the plasma display panel includes a front glass 300 and a rear glass 302 as known in the art. The plasma display panel includes a display area 304 and a non-display area 305. A heating element 306 is formed on the glass at the non-display area 305. The heating element 306 is constructed to form a single electronic circuit that surrounds the display area 304 and a driving circuit (not shown) drives the heating element 306. The heating element 306 generates heat to raise the temperature of the non-display area 305 of the glass for reducing the temperature difference between the display area 304 and the non-display area 305. FIG. 3A shows the schematic that the thermal gradient profile is smoother than the one without installing the heating element 306. The indexes 307, 308 denote the bright display and the dark display areas, respectively. The curve denoted by the dash line represents the temperature curve before adding the heating element 306, while the solid line indicates the result after the heating element 306 raises the temperature. In general, the bright display area 307 occupies only a portion of the display area and the location of the bright display area 307 is difficult to be precisely predicted. Therefore, it is unlikely to predict which portion of the heating element 306 should be turned on under such configuration i.e., it is difficult to heat only the portion of non-display area adjacent to the bright display area 307. In that case, the simplest solution is to make the entire non-display area heated by the heating element 304. Preferably, the temperature raised by the heating element 306 is at the range between the maximum temperature of the bright display area and the original temperature of the non-display area adjacent to bright display 307 without heating. The state of the heating element 306 is controlled by the driving circuit. Because the entire non-display area is heated by the same heating element 306, the above example has a problem that the temperature variation between the non-display area and the dark display area (background) will become too high to cause the panel fracture. One proposed solution is that the temperature heated by the heating element 306 is limited to a value less than the temperature of the bright display area. Preferably, the temperature heated by the heating element 306 is set as the average value of the temperature of the bright display area and the dark display area.

Figure 3B:
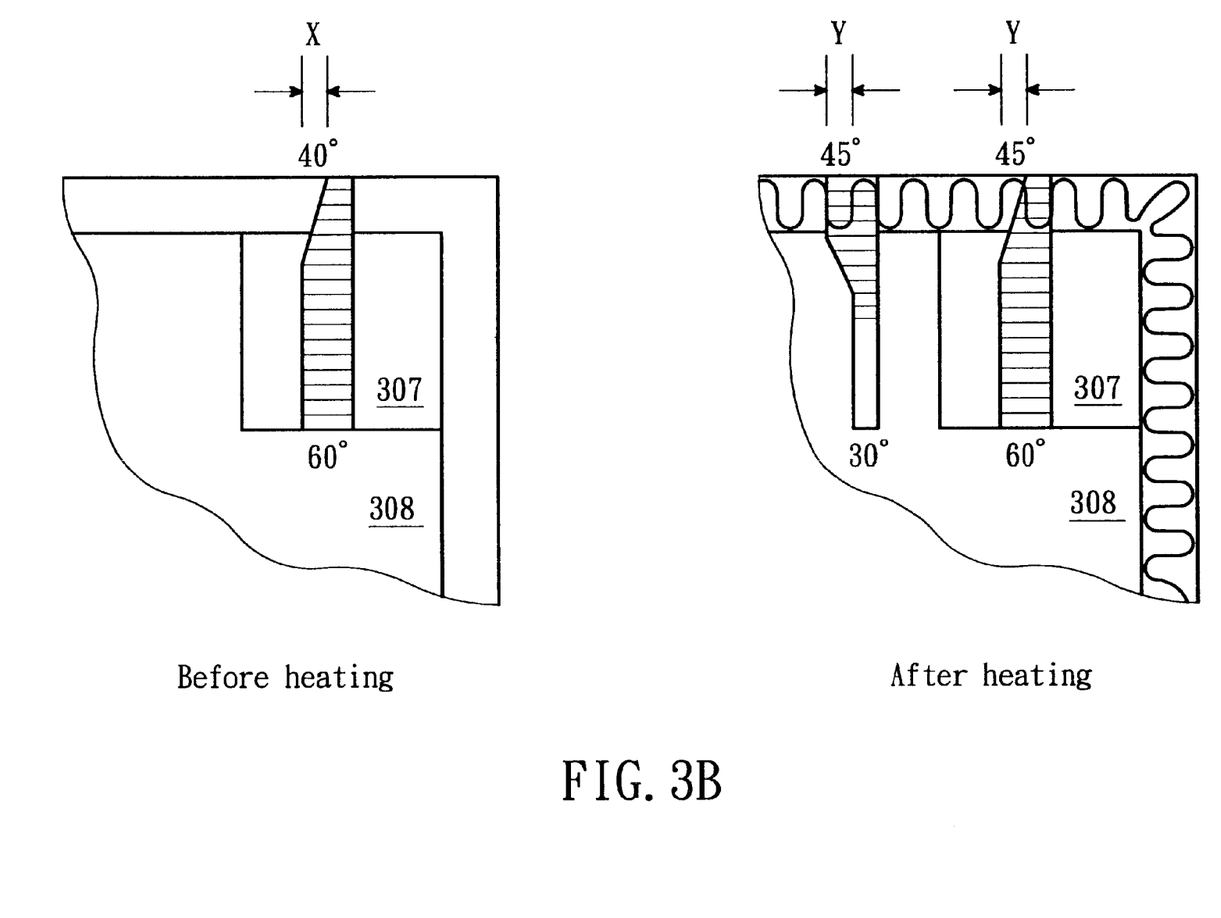
FIG. 3B illustrates an example of temperature distribution of the display panel before and after heating according to the present invention.

FIG. 3B illustrates an example of temperature distribution of the display panel without and with heating according to the first embodiment. In this embodiment, the temperature of the bright display area 307 is 60° C. and the temperature of the dark display area 308 is 30° C. The heating element is heated to 45° C. which is the average value of the dark display area temperature and the bright display area temperature, to reduce the temperature gradient between the non-display area and the display area.

Figure 4A:
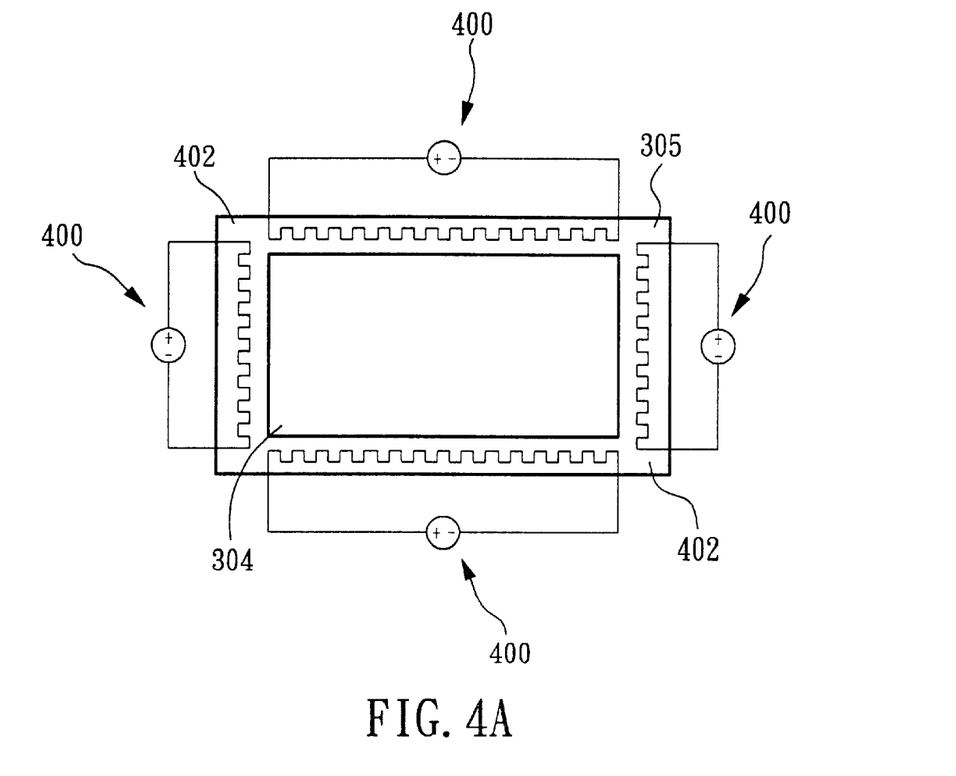
FIG. 4A is another embodiment according to the present invention.
Figure 4B:
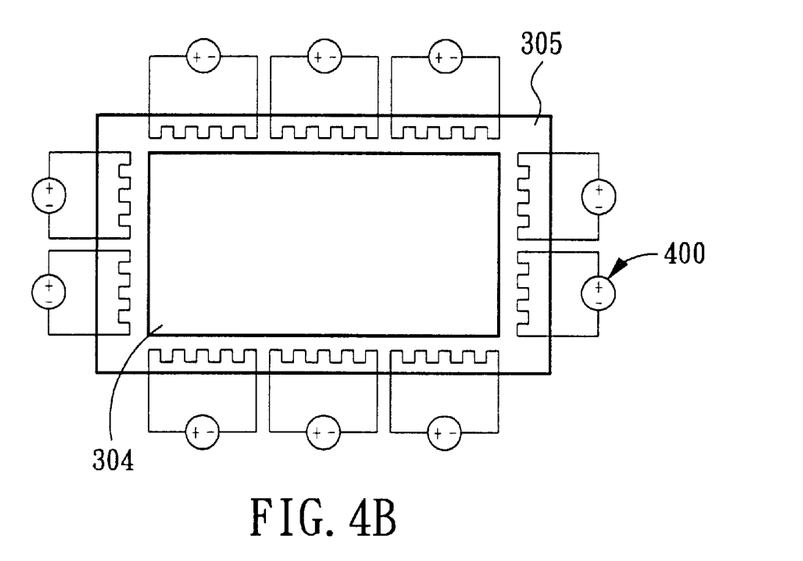
FIG. 4B is another embodiment according to the present invention.
Figure 4C:
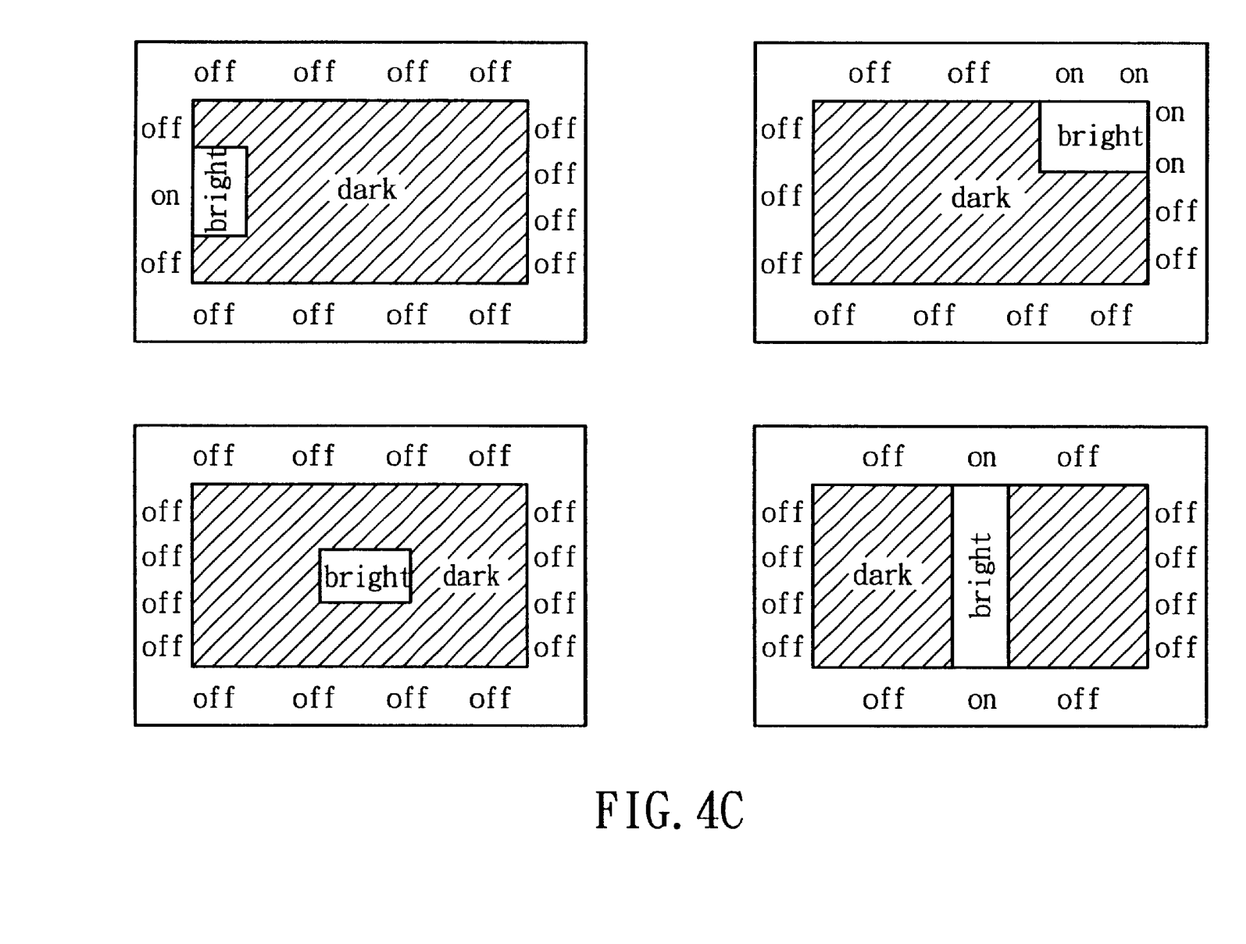
FIG. 4C illustrates the states of the heating element under various display condition according to the present invention.

FIG. 4A schematically shows a second embodiment of the present invention for heating the non-display area 305 of the display panel. Four flexible heaters 400 are arranged at the non-display area 305 of a glass panel 402. Each of the four flexible heaters 402 can be separately turned on/off for selectively heating a predetermined neighboring area. FIG. 4B illustrates another embodiment of the present invention. It contains more independent heaters 400 disposed on each side. Preferably, each side of the panel has n heating elements formed thereon, wherein n is equal or larger than 1. During the operation, only the heating element adjacent to a bright display area is turned on for heating portion of the non-display area, others are still turned off. If the bright display area is located at the central portion of the display area, then all of the heating elements are turned off. FIG. 4C shows some situations of the bright display area occupying different portion of the display area and the corresponding on-off status of the heating elements according to the present invention. It shows only the heating element adjacent to the bright display area is turned on for heating.

Figure 4D:
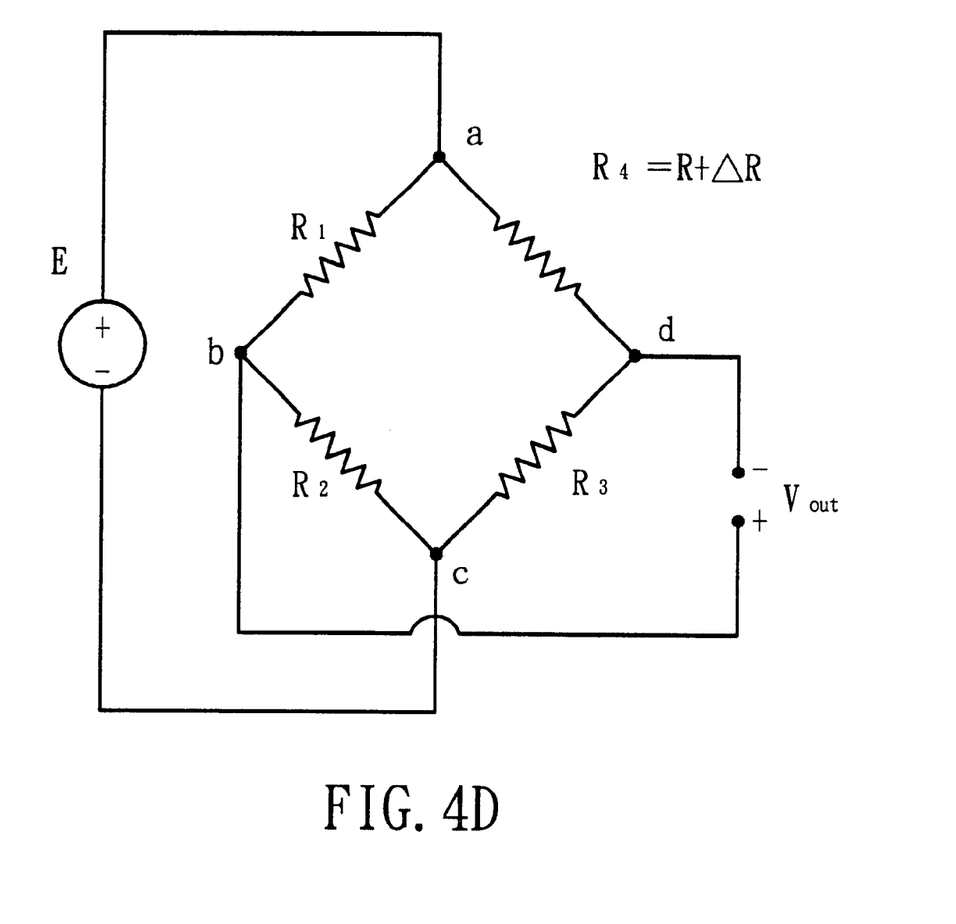
FIG. 4D illustrates the Wheatstone Bridge Circuit according to the present invention.

In a preferred embodiment, the heating element not only performs the function of heating but also acts as a "temperature sensor" for the driving circuits. As well known in the art, the resistance of the heating element is generally increased as the temperature raises, and the resistance is decreased as the temperature reduced. One can control the on-off status of the heating element by using the characteristic. The heating element may be formed by coating or taping flexible heaters. As a preferred embodiment shown in FIG. 4D, the heating element and a part of the driving circuits construct a Wheatstone Bridge Circuit. Assume that R1, R2, R3 respectively indicate resistors with a resistance R (R1=R2=R3=R). All of the resistors are embedded in the driving circuit. The resistance R4 refers to the heating element formed on the panel and R4=R+ΔR (ΔR represents the resistance variation in response to the temperature variation). A voltage E is applied across the node a-c, output voltage ($V_{out}$) is across the node b-d. As known in the technique, $V_{out}$ΔRE/(4R+2ΔR). If 4R>>2ΔR, then $V_{out}$ is approximately equal to ΔRE/4R. Further, the resistance of the heating element at a given temperature T can be represent as follows.

$$R_T = R_{T0}(1 + \alpha_0 \Delta T)$$

Wherein the $R_T$ indicates the resistance of the heating element at a temperature T, while the $R_{T0}$ indicates the resistance of the heating element at a reference temperature $T_0$. $\alpha_0$ represents the temperature coefficient of the heating element and ΔT means the temperature variation between $T_0$ and T. If the temperature of the heating element (may be formed of conductor) raises from $T_0$ to T due to the increased temperature of the panel. The change of the resistance is:

$$\Delta R = R_T - R_{T0} = \alpha_0 \Delta T \, R_{T0}$$

Therefore, ΔT is related to the ΔR and ΔR is related to $V_{out}$ (by the relationship: $V_{out}$=ΔRE/4R for 4R>>2ΔR). Hence, by detecting the output voltage $V_{out}$, the heating element itself can be used as a sensor to active the driving circuits for turning on/off the heating element. The driving circuit can be set to turn on the heating element when the output voltage $V_{out}$ reaches a predetermined value, or the driving circuits turns off the heating element when the output voltage $V_{out}$ is below the predetermined value. The heating element generates heat to the non-display area of the display area to narrow the temperature difference between the display area and the non-display area. The power supplier provides a constant power to the heating element.

Figure 5:
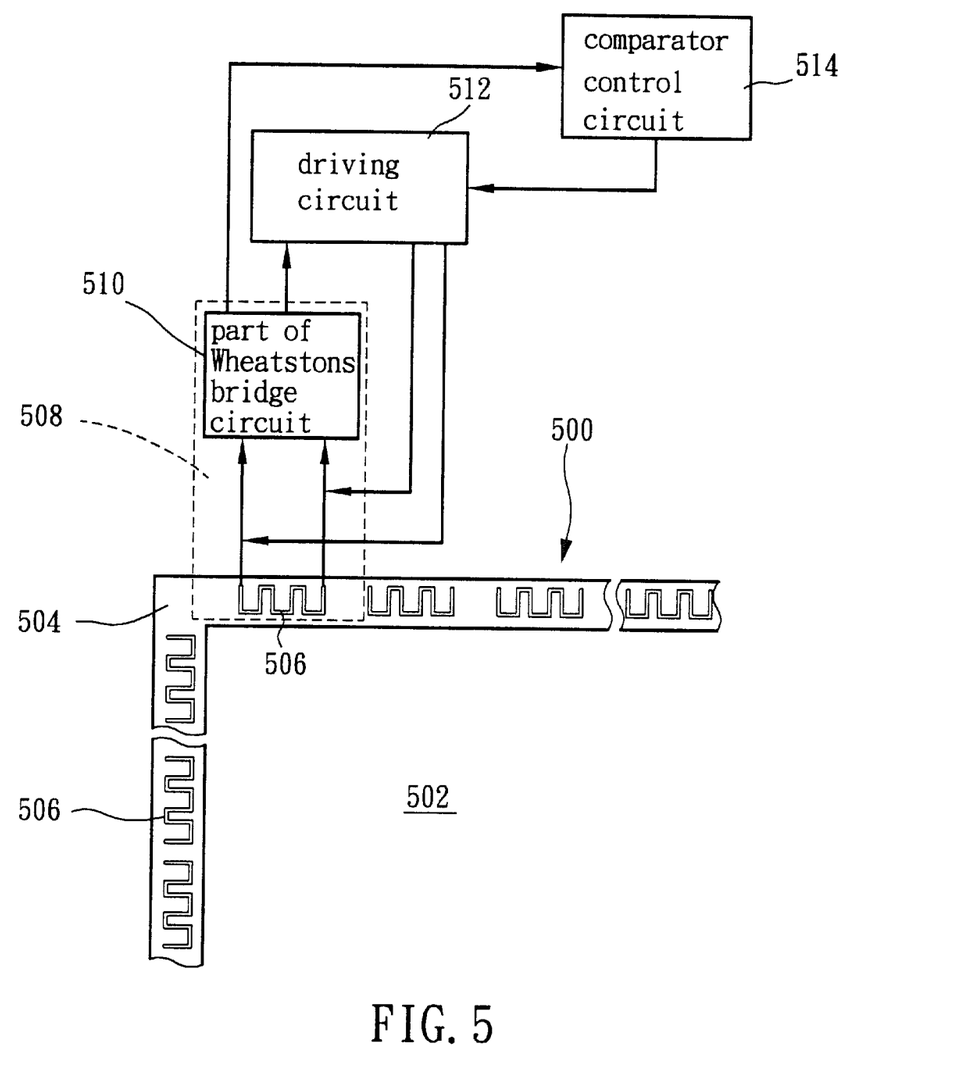
FIG. 5 illustrates the control module according to the present invention.

Referring to FIG. 5, it illustrates the functional diagram of a control model.

Reference number 500 indicates a panel which includes a display area 502 and a non-display area 504. A plurality of heating elements 506 is formed on the non-display area 504. The heating element 506 acts as a resistor (R4 as in FIG. 4D) and combines with a circuit 510 to form the Wheatstone Bridge Circuit 508. A driving circuit 512 is coupled to the circuit 510 for driving the heating element 506. A comparator control circuit 514 is next coupled to the driving circuit. The heating element 506 acts a sensor to detect directly or indirectly the temperature of the non-display area 504. The output voltage ($V_{out}$) is equal to ΔRE/4R under a given applied power and resistance. If the temperature of the non-display area raises ΔT due to adjacent to a higher temperature bright display area displayed on the display area, Then the change of the output voltage $V_{out}$ is proportional to the ΔT. The comparator control circuit 514 is responsive to the variation to compare the output voltage $V_{out}$, at temperature T with a predetermined value. If the detected output voltage $V_{out}$ is higher than the predetermined value, then the comparator control circuit 514 will send a signal to the driving circuit 512 to turn on the heating element 506. Otherwise, if the detected output voltage $V_{out}$ is lower than the predetermined value, then the driving circuit 512 turns the heating element 506 off.

Although the present invention uses the heating element as the sensor to detect the temperature of the glass panel. However, it is not used to limit the scope of the present invention. For example, an individual sensor can be used to detect the temperature of the glass panel, then the sensor sends a signal to the comparator to process the situation.

As is understood by a person skilled in the art, the foregoing embodiments of the present invention are illustrated of the present invention rather than limiting of the present invention. It is intended to cover various modifications and similar arrangements included within the spirit and scope of the appended claims.

What is claimed is:

1. A plasma display device having a plasma display panel comprising:
   a display area and a non-display area, said non-display area surrounded by said display area;
   a plurality of heating elements distributed in said non-display area for individual heating of adjacent portions of said non-display area; and
   a plurality of apparatus for controlling said heating elements, each apparatus comprising a driving circuit, a comparator control circuit, and at least three resistors, said three resistors and one of said heating elements constructing a Wheatstone bridge circuit;
   wherein as a portion of said display area is lit, one of said heating elements located in said non-display area adjacent to said portion of said display area that is lit is activated so as to reduce a temperature difference between said portion of said display area that is lit and said non-display area adjacent thereof.

2. The plasma display device of claim 1, wherein said three resistors have the same resistance as said heating element before said plasma display device is activated.

3. The plasma display device of claim 1, wherein said heating elements each is controlled by comparing an output voltage of said Wheatstone bridge circuit and a predetermined value set in said comparator control circuit, and said heating element is activated when said output voltage is higher than said predetermined value.

4. A plasma display device comprising:
   a plasma display panel having a display area and a non-display area surrounding said display area,
   a Wheatstone bridge circuit having three members and a heating element, said three members being positioned outside of said display panel, said heating element being located in said non-display area, and said Wheatstone bridge circuit being used to sense a temperature variation between said display area and said non-display area;
   a driving circuit coupled to said Wheatstone bridge circuit; and
   a comparator control circuit coupled with said driving circuit;
   wherein said heating element is activated by operations of said Wheatstone bridge circuit, said driving circuit, and said comparator control circuit.

5. The plasma display device of claim 4, wherein said three members are three resistors, and each resistor has the same resistance as each of said heating elements before said plasma display device is activated.

6. The plasma display device of claim 4, wherein each of said heating elements are controlled by comparing an output voltage of said Wheatstone bridge circuit and a predetermined value set in said comparator control circuit, and said heating element is activated when said output voltage is higher than said predetermined value.

7. A plasma display device having a plasma display panel which contains a display area and a non-display area comprising:
- a plurality of Wheatstone bridge circuits, each consisting of three members and a heating element, said three members located outside of said display panel, and said heating element mounted on said non-display area so that said heating element can sense temperature variations;
- a plurality of driving circuits, each coupled with one of said Wheatstone bridge circuits;
- a plurality of comparator control circuits, each coupled with one of said driving circuits; and each of said heating elements being controlled by the activation of said display area by means of operations of said Wheatstone bridge circuit, said driving circuit, and said comparator control circuit.

8. The plasma display device of claim 7, wherein said three members are resistors, and each has the same resistance as each of said heating elements before said plasma display device is activated.

9. The plasma display device of claim 7, wherein a first and a second of said three members are connected at a first node in series, resulting end terminals thereof connecting to a power supply to provide current, further wherein the remaining one end of said heating element is connected at a second node in series, resulting end terminals thereof connecting to said power supply.

10. The plasma display device of claim 9, wherein each of said heating elements if activated or not is through a comparison between the output voltage of said Wheatstone bridge circuit and a predetermined value set in said comparator control circuit, said output voltage being a voltage drop between said first node and said second node.

11. The plasma display device of claim 9, wherein each of said heating elements are activated when said output voltage is higher than said predetermined value.

\* \* \* \* \*